US007229883B2

(12) United States Patent
Wang et al.

(10) Patent No.: US 7,229,883 B2
(45) Date of Patent: Jun. 12, 2007

(54) PHASE CHANGE MEMORY DEVICE AND METHOD OF MANUFACTURE THEREOF

(75) Inventors: Chao-Hsiung Wang, Hsin-Chu (TW); Li-Shyue Lai, Jhube (TW); Denny Tang, Saratoga, CA (US); Wen-Chin Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 162 days.

(21) Appl. No.: 11/064,132

(22) Filed: Feb. 23, 2005

(65) Prior Publication Data

US 2006/0186440 A1    Aug. 24, 2006

(51) Int. Cl.
   *H01L 21/336*   (2006.01)
(52) U.S. Cl. .................... 438/266; 257/27.085
(58) Field of Classification Search ................ 438/266; 257/4, 3
   See application file for complete search history.

(56) References Cited

U.S. PATENT DOCUMENTS

| 6,252,244 | B1 | 6/2001 | Reinberg |
| 6,420,725 | B1 * | 7/2002 | Harshfield ............... 257/4 |
| 6,511,862 | B2 | 1/2003 | Hudgens et al. |
| 6,512,241 | B1 | 1/2003 | Lai |

* cited by examiner

*Primary Examiner*—Walter Lindsay, Jr.
*Assistant Examiner*—Elias Ullah
(74) *Attorney, Agent, or Firm*—Haynes and Boone, LLP (57) ABSTRACT

A method of manufacturing a memory device is provided. The method includes forming an electrode over a substrate. The method also includes forming an opening in the electrode to provide a tapered electrode contact surface proximate the opening. The method further includes forming a phase change feature over the electrode and on the tapered electrode contact surface.

24 Claims, 7 Drawing Sheets

PHASE CHANGE MEMORY DEVICE AND METHOD OF MANUFACTURE THEREOF

FIELD OF DISCLOSURE

The present disclosure relates generally to the field of microelectronic devices and, more particularly, to a phase change memory and method of manufacture thereof.

BACKGROUND

Phase change material used in some memory devices ("phase change memory devices"), generally exhibits two phases (or states), amorphous and crystalline. The amorphous state of the phase change material generally exhibits greater resistivity than the crystalline state. The state of the phase change material may be selectively changed by a stimulation, such as an electrical stimulation. Such electrical stimulation may be applied, for example, by supplying an amount of current through an electrode in contact with the phase change material.

For a phase change memory device, it is desirable to reduce the size of a contact area between the electrode and the phase change material because the size of the contract area is directly related to the amount of current needed to change the state of the phase change material. Therefore, reducing the size of the contact area also reduces the amount of current needed to change the state of the phase change material in the memory device, resulting in a more efficient memory device.

Accordingly, what is needed is a device and method of manufacture thereof, addressing the issues discussed above.

BRIEF DESCRIPTION OF THE DRAWINGS

In the accompanying figures, in accordance with the standard practice of the industry, various features are not drawn to scale. In fact, dimensions of the various features may shown to be increased or reduced for clarity.

DETAILED DESCRIPTION

The following discussion provides many different embodiments, or examples, for implementing different features of various embodiments. Also, specific examples of components and arrangements are described for clarity, and are not intended to limit the scope this disclosure. Moreover, the following discussions repeat reference numerals and/or letters in the various examples, and such repetitions are also for clarity and does not itself indicate a relationship between the various embodiments and/or configurations discussed. Still further, references indicating formation of a first feature over or on a second feature include embodiments in which features are formed in direct contact, and also embodiments in which one or more additional features are formed, interposing the first and second features, such that the first and second features are not in direct contact.

Figure 1:
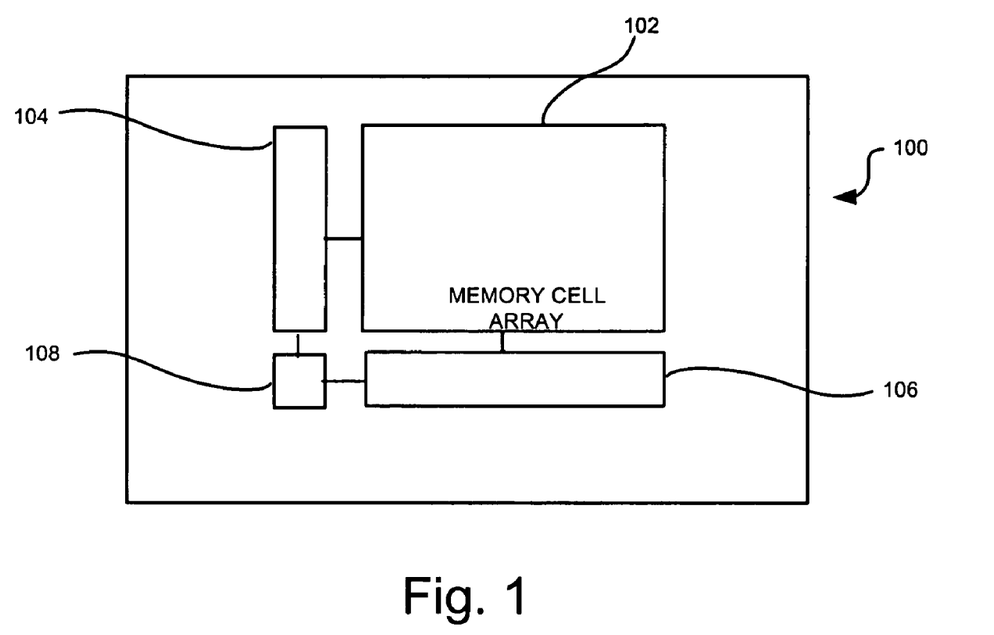
FIG. 1 is a block diagram of an integrated circuit according to the illustrative embodiment.

FIG. 1 is a block diagram of an integrated circuit ("IC"), indicated generally at 100, according to an illustrative embodiment. The IC 100 includes a memory cell array 102, and array logic/interface circuitries 104 and 106. The circuitry 104 includes various logic circuitries such as row/word latches, a decoder and/or a buffer. The circuitry 106 includes other logic circuitries such as column/bit/digit lines, a decoder, amplifiers, and/or a buffer. The IC 100 also includes a control circuitry 108. The circuitry 108 includes, for example, circuitries for input/output ("I/O") timing and refresh control. Moreover, depending on the particular version of the illustrative embodiment, the geometric arrangement of the memory cell array 102 varies. For example, in one version of the illustrative embodiment, the memory cell array 102 is located partially or substantially over the circuits 104, 106, and 108.

Figure 2:
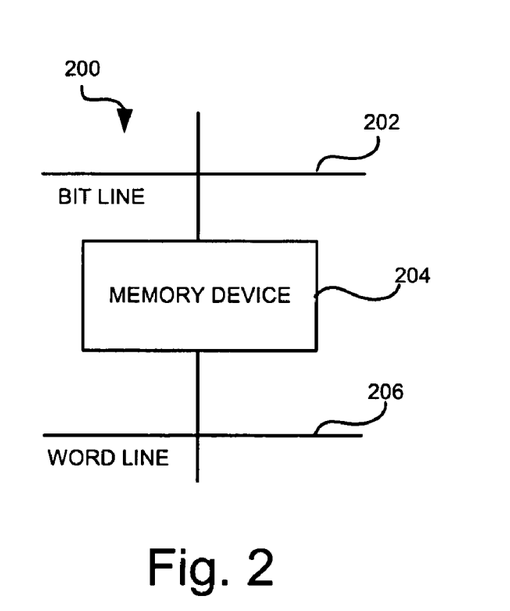
FIG. 2 is a circuit diagram of a memory cell according to the illustrative embodiment.

FIG. 2 is a circuit diagram of a memory cell, indicated generally at 200, according to the illustrative embodiment. The memory cell 200 includes a memory device 204, at least one word line 206, and at least one bit line 202. The memory cell 200 also includes semiconductor doped regions, conductive material, and/or electrical insulating material. The memory device 204 includes a plurality of semiconductor layers, each for storing at least one logical binary state. For example, in at least one version of the illustrative embodiment, the memory device 204 includes a layer for storing a logical binary state in response to thermal energy. In another version of the illustrative embodiment, the memory device 204 includes a layer for storing logical binary state in response to a magnetic field. In both versions, the response is associated with a detectable change in the electrical and/or crystalline properties of the layer's material, to provide one or more memory functions. For example, the word line 206 includes at least one conductive interconnect proximate the memory device 204 such that the word line 206 provides a current to induce heating in the memory device 204. Similarly, the bit line 202 includes at least one conductive interconnect proximate the memory device 204 for reading information from and/or writing information to the memory device 204.

Figure 3A:
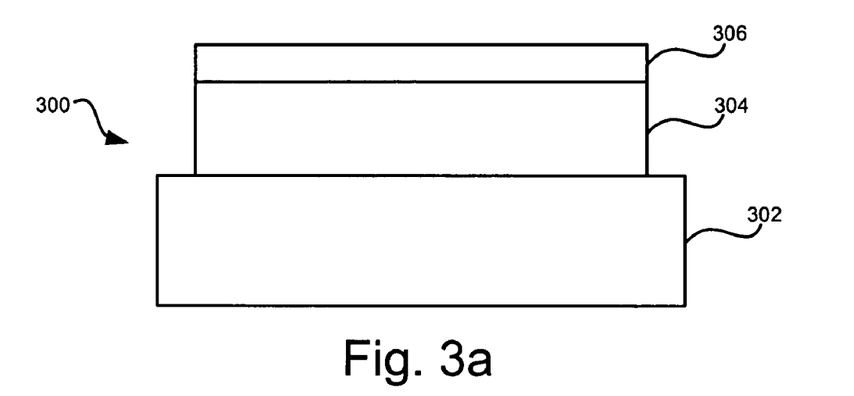
FIGS. 3a-e are successive sectional views of a memory device according to the illustrative embodiment.

FIG. 3a is a sectional view of a memory device, indicated generally at 300, in an initial stage of manufacture according to the illustrative embodiment. The memory device 300 is representative of the memory device 204 of FIG. 2, and includes a substrate 302, an electrode 304, and an insulator (e.g., dielectric spacer) 306.

The substrate 302 includes one or more devices formed on conventional substrate materials including, silicon-on-insulator ("SOI") substrate, polymer-on-silicon substrate, silicon, gallium arsenide, gallium nitride, strained silicon, silicon germanium, silicon carbide, diamond, and/or other suitable material. In one version of the illustrative embodiment, the substrate 302 includes a fully depleted SOI substrate wherein an active device silicon layer thickness range is between approximately 200 nm and approximately 50 nm. In another version of the illustrative embodiment, the substrate 302 also includes an air gap for providing insulation for the memory device 300. For example, the substrate 302 includes a "silicon-on-nothing" ("SON") substrate including a thin insulation layer. The thin insulation layer includes air and/or other gaseous composition. The memory device 300 also includes a SiGe layer and a Si cap layer located over the SiGe layer, and the SiGe layer is subsequently removed.

Accordingly, the Si cap layer is an "active region" for the memory device 300. The Si cap layer is located over a gap formed in response to removing the SiGe layer. The gap includes air and/or other insulating materials.

The electrode 304 includes one or more layers of polysilicon, metal, and/or other materials such as Ti, TiN, Ta, TaN, Cu, Al, Mo, Co, W, WN, MoSi, WSi, CoSi, and/or other material. The electrode 304 is formed by atomic layer deposition ("ALD"), chemical vapor deposition ("CVD"), metal-organic CVD ("MOCVD"), plasma-enhanced CVD ("PECVD"), evaporation, and/or other suitable techniques. Also, depending on its material, the electrode 304 is formed by a selective deposition over the substrate 302 or a blanket deposition over the substrate 302 followed by a patterning process, depending on the material used for the electrode 304. Such patterning process includes wet and/or dry etching employing a mask, masking process, and/or photolithographic process. In one version of the illustrative embodiment, the thickness of the electrode is within a range between approximately 450 Angstroms and approximately 10,000 Angstroms. Such thickness of the electrode is variable in response to shapes of contact area (V- or U-shaped opening) discussed below. For example, with a V- or U-shaped opening, thickness of the electrode is in the range of approximately 2500 Angstroms and approximately 8500 Angstroms. With a truncated V- or U-shaped opening, thickness is less than approximately 4500 Angstroms.

The insulator 306 includes oxygen containing dielectric such as silicon oxide (e.g., $SiO_2$), nitrogen containing dielectric such as silicon oxynitride, silicon nitride (e.g., SiON, SiON:H and $Si_3N_4$), organic dielectric such as polymer, low-k dielectric such as fluorine doped glass and carbon doped glass, and/or any other material suitable for electrical insulation or hard mask or anti-reflection layer during lithography. The insulator 306 is formed over the electrode 304 by ALD, CVD, PECVD, PVD, evaporation, or any other suitable technique. The insulator has a thickness between approximately 50 Angstroms and approximately 1200 Angstroms. Such thickness is variable in response to slope of the tapered opening.

Figure 3B:
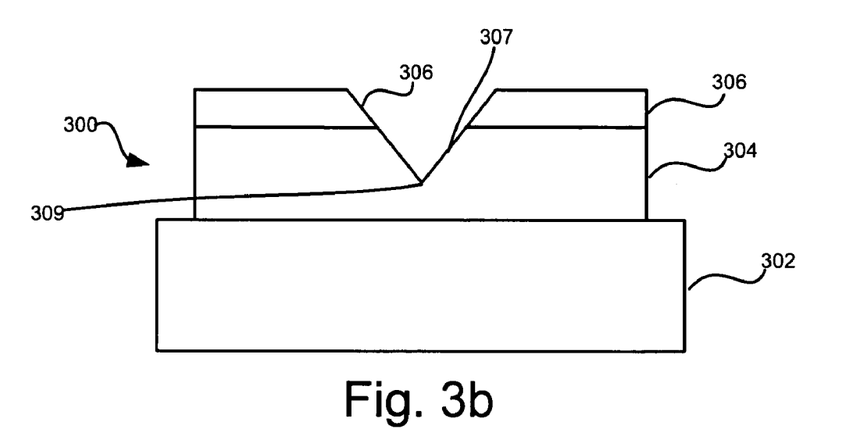

FIG. 3b is a sectional view of the memory device 300 according to the illustrative embodiment, in a subsequent stage of manufacture. At this stage, memory device 300 now includes a tapered opening (e.g., a cavity) 307 extending through insulator 306 and partially into electrode 304 as shown. The tapered cavity 307 is inwardly tapered, and includes a relatively wide portion (e.g., a portion near the opening of the cavity) and a relatively narrow portion (e.g., a portion near the bottom or the inner end of the cavity). Also, in the illustrative embodiment, the inner walls of the tapered cavity converge into a vertex 309 forming a substantially V-shaped cavity. However, in at least one alternative embodiment, the walls of the tapered cavity do not converge into a vertex. Such an alternative embodiment is discussed in more detail below in connection with FIGS. 4a-e. Moreover, the tapered cavity 307 is formed in the electrode 304 by forming it through the insulator 306.

The tapered cavity 307 includes a slope that is variable in response to the insulator 306's thickness. The tapered cavity is formed in part by a removal technique that extends through insulator 306 and into the electrode 304. The technique includes a radiation sensitive coating (e.g., photo resist) over the insulator 306 and exposing the coating to form a predetermined opening area for forming the cavity 307. After such exposure and developing the radiation sensitive coating, the insulator 306 is removed by a wet etching or a dry etching technique such as reactive ion etch. The tapered cavity 307 is then formed by using substantially similar wet etching or dry etching techniques. However, various chemicals present in the wet etch and dry etch are capable of being used for the insulator 306 and the electrode 304 because the tapered cavity 307's slope is more favorable. In one example, a solution including $NH_4PO_3$ is used to remove a portion of the insulator 306 if the insulator 306 is a nitrogen containing insulator such as silicon oxynitride and silicon nitride (e.g., SiON, SiON:H, or $Si_3N_4$). If the electrode 304 includes aluminum or tungsten, the tapered cavity 307 is formed by a first plasma etching process using a gas mixture comprising $BCl_3$ and $Cl_2$ at predetermined flow rates and operating at low pressure until the exposed portion of the electrode 304 is removed. The electrode 394 is then further subjected to a second plasma etching process using similar parts in the gas mixture, similar pressure, and with similar flow rate of $BCl_3$. However, with the second plasma etching process, flow rate of the $Cl_2$ is reduced so that side walls of the cavity 307 becomes tapered by lateral facet propagation of resist using chlorine species. Accordingly, in connection with forming the tapered cavity, a portion of the insulator 306 is removed as shown in FIG. 3b.

Figure 3C:
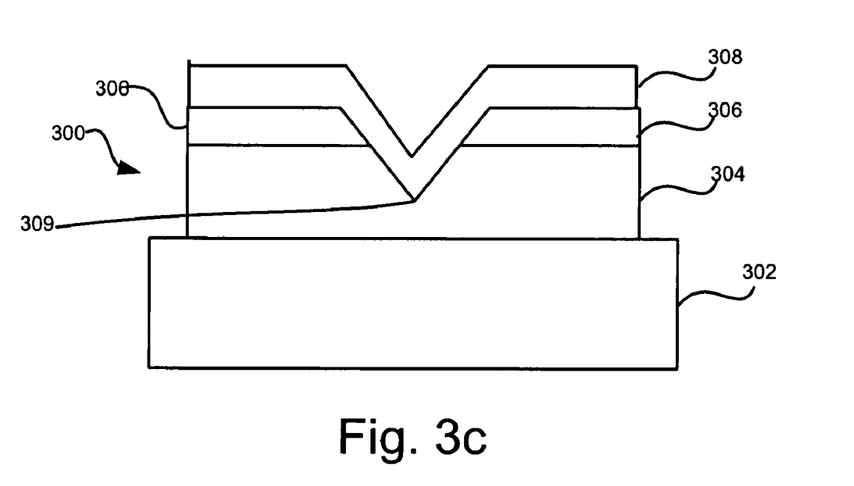

FIG. 3c is a sectional view of the memory device 300 of FIG. 3b in a subsequent stage of manufacture. The memory device 300 also includes an insulator 308, which is formed over the insulator 306 (the remaining portion of the insulator 306) and the electrode 304 (the tapered cavity of the electrode 304). The insulator 308 is formed in a manner similar to the formation of the insulator 306, which is discussed in more detail above in connection with FIG. 3a. Thickness of the insulator 308 ranges from approximately 50 Angstroms to approximately 1000 Angstroms. However, the thickness is variable dependent on dimensions of top opening of the cavity 307. In one example, the insulator 306's thickness is less than approximately 800 Angstroms, and the dimension of the cavity 307's opening is less than approximately 0.5 μm.

Figure 3D:
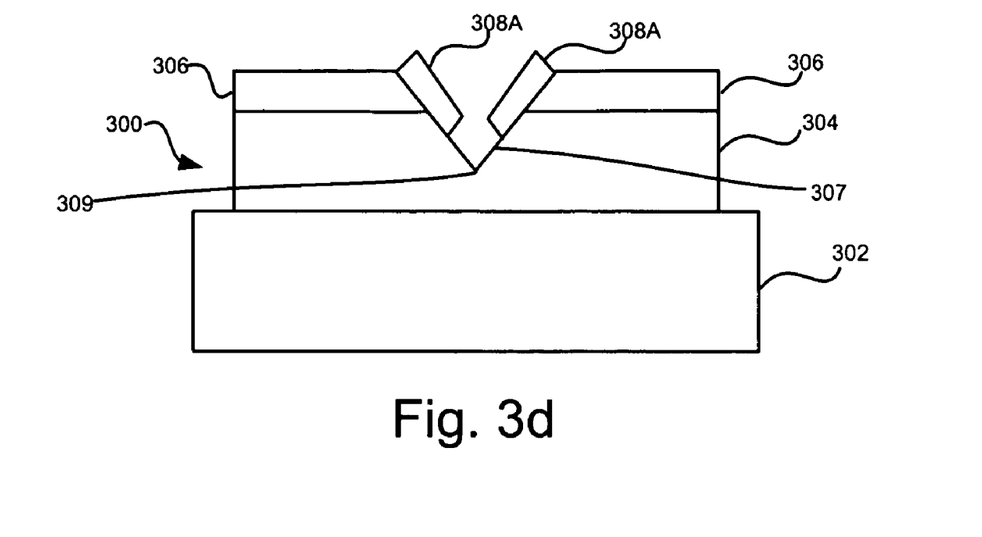

FIG. 3d is a sectional view of the memory device 300 of FIG. 3c in a subsequent stage of manufacture. As can be seen, a portion of the insulator 308 is now removed, exposing the insulator 306 and a portion of the tapered cavity 307 formed in the electrode 304. More particularly, by removing the portion of the insulator 308, a narrow portion of the tapered cavity is exposed. A remaining insulator portion 308A, remains over a wide portion of the cavity 307. Portions of the insulator 308 are removed by etch back, CMP, and/or any other suitable technique to form the structure seen in FIG. 3D. For example, a direct dry etch back to the insulator 308 is capable of being performed without a masking layer. In another example, the insulator 308 is capable of being patterned and planarized (e.g., via CMP or spin-on-coating). After such processes, the cavity 307's vertex is exposed.

Figure 3E:
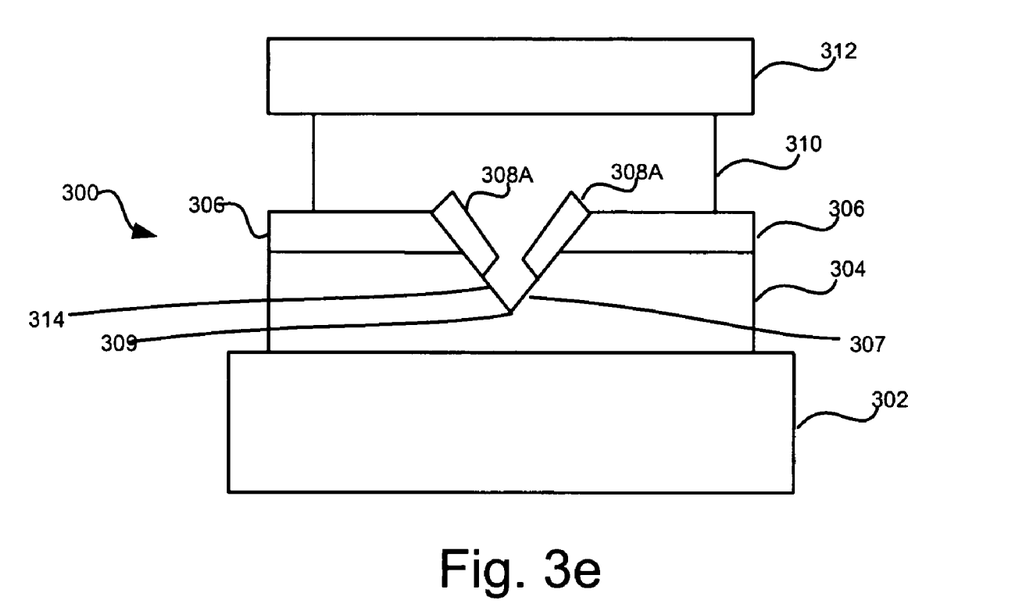

FIG. 3e is a sectional view of the memory device 300 of FIG. 3d in a subsequent stage of manufacture. At this stage of manufacture, the memory device 300 includes a phase change feature 310 formed over the remaining portion of the insulator 306), the remaining insulator portion 308A and the exposed portion of the electrode 304. Accordingly, the phase change feature 310 and the electrode 304 are in "active" contact (e.g., the electrode 304 is capable of supplying current to the phase change feature 310) with each other through an area 310 (e.g., "contact area" or the portion of the electrode 304 that is exposed). Because the electrode 304 is exposed at a narrow portion of the tapered cavity, the area 314 is also located at a narrow portion of the tapered cavity. As can be seen, the area 314 is substantially "V-shaped".

Also, the memory device 300 includes an electrode 312 formed over the phase change feature 310. The electrode 312 is similar to the electrode 304 (discussed in more detail above in connection with FIG. 3a). Also, the area 314 is treated via ion implantation at an impurity energy ranging between approximately 1 KeV and approximately 800 KeV, and an impurity concentration ranging between approximately $1 \times 10^{13}$ atoms/cm$^3$ and approximately $1 \times 10^{19}$ atoms/cm$^3$, although different ranges are suitable in other versions of the embodiment. A sheet resistance of the contact region is then increased to perform a suitable local thermal generator.

In the illustrative embodiment, the ion implantation process includes plasma source ion implantation or plasma source ion immersion ("PSII"). PSII includes exposing the electrode 304 to a plasma source, while applying a bias to the substrate 302. PSII utilizes tools such as a single and/or a batch of wafer reactor, wherein a direct current ("DC") and/or a radio frequency ("RF") bias is applied to the substrate 302. The reactor includes a process ambient pressure, ranging between, approximately 0.01 mTorr and approximately 1000 Torr. The substrate 302 is exposed to a temperature ranging between approximately 150° C. and approximately 1100° C. The plasma source includes microwave electron cyclotron resonance ("ECR") plasma, helicon plasma, inductively coupled plasma, and/or other suitable sources of plasma. Also, the plasma includes Ar, H, N, Xe, O, As, B2H6, GeH4, P, and/or other substances. Moreover, the plasma utilizes RF power ranging between approximately 200 Watts and approximately 2500 Watts, and the applied bias is within a range of approximately +/−200 V and approximately +/−5000 V. Applying the bias to the substrate 302, while exposing the substrate 302 to the plasma source, creates an extended plasma sheath substantially covering the memory device 300. In the memory device 300, accelerating ions and/or electrons away from the sheath results in accelerating the ions of the impurity into the insulator 306 and/or the electrode 304.

The phase change feature 310 includes a chalcogenide material or one or more other suitable materials, which exhibit a change in their electrical characteristics (e.g., resistivity) in response to an induced stimulus (e.g., electrical current). In a chalcogenide material, such an exhibition of a change in its electrical characteristics is caused by an associated change in its phase (e.g., from an amorphous phase to a crystalline phase, and vice versa) in response to the induced stimuli. Accordingly, in response to an induced stimulus, the phase change feature 310 is capable of performing a conventional memory function (e.g., store a binary state) of the memory device 300.

Suitable materials for the phase change feature 310 include various binary, ternary, quaternary, and/or other alloy material. Such binary alloy materials include GaSb, InSe, $Sb_2Te_3$, and GeTe. Such ternary alloy materials include $Ge_2Sb_2Te_5$, InSbTe, GaSeTe, $SnSbTe_4$, and InSbGe. Such quaternary alloy materials include AgInSbTe, (GeSn) SbTe, GeSb(SeTe), and $Te_{81}Ge_{15}Sb_2S_2$. In other versions of the illustrative embodiment, the phase change feature 310 includes other materials such as Si, diamond, and/or GaAs nanoparticles.

The phase change feature 310 is formed by ALD, CVD, MOCVD, PECVD, evaporation, and/or other suitable technique. Forming the phase change feature 310 also includes ion implantation, such as implanting GaSeTe into Ge, SiGe, SiC, C, carbide, strained SiGe, and/or other material. Moreover, after its formation, the phase change feature 310 is patterned, planarized (e.g., by CMP), and/or otherwise modified.

Figure 4A:
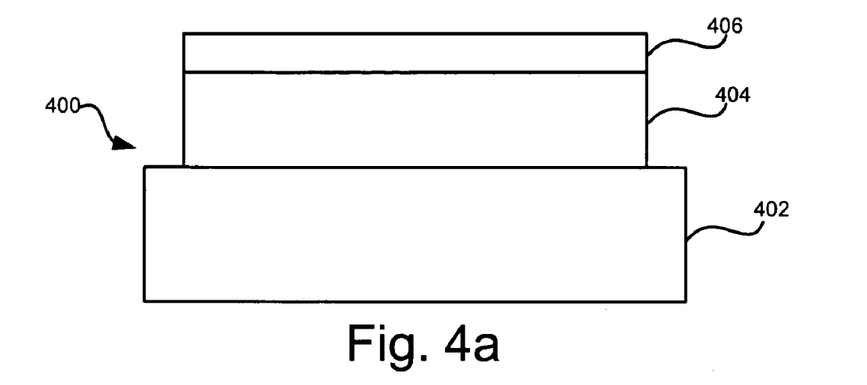
FIGS. 4a-e are successive sectional views of a memory device according to a first alternative embodiment.

FIG. 4a is a sectional view of a memory device, indicated generally at 400, in an initial stage of manufacture, according to a first alternative embodiment. Also, FIGS. 4b-e are sectional views of the memory device 400, in subsequent stages of manufacture, according to the alternative embodiment. The device 400 is representative of the memory device 204 of FIG. 2. Also, the device 400 and techniques used for manufacture thereof, are similar to the device 300 and the techniques used for manufacture thereof, respectively. For example, the device 400 of FIG. 4a, includes a substrate 402, an electrode 404, and an insulator 406, which are respectively similar to the substrate 302, the electrode 304, and the insulator 306, all of which are discussed in more detail above (in connection with FIG. 3a). Likewise, the device 400 includes an insulator 406 (of FIG. 4b), an insulator 408 (of FIG. 4c), a phase change feature 410 (of FIG. 4e), and an electrode 412 (of FIG. 4e), which are respectively similar to the insulator 306 (discussed in more detail above in connection with FIG. 3b), the insulator 308 (discussed in more detail above in connection with FIG. 3c), the phase change feature 310 (discussed in more detail above in connection with FIG. 3e), and the electrode 312 (discussed in more detail above in connection with FIG. 3e). Accordingly, the above discussions in connection with FIGS. 3a-e, such as regarding techniques and materials for forming features (e.g., the electrode 304) and/or removing a portion of such features of the device 300, are generally applicable to FIGS. 4a-e. The following discussion focuses on an aspect of the alternative embodiment that is different from the illustrative embodiment already described.

Figure 4B:
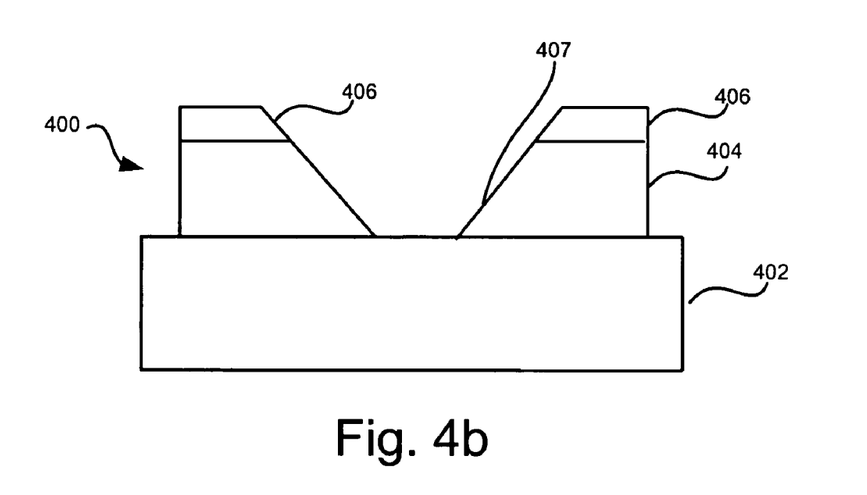
Figure 4C:
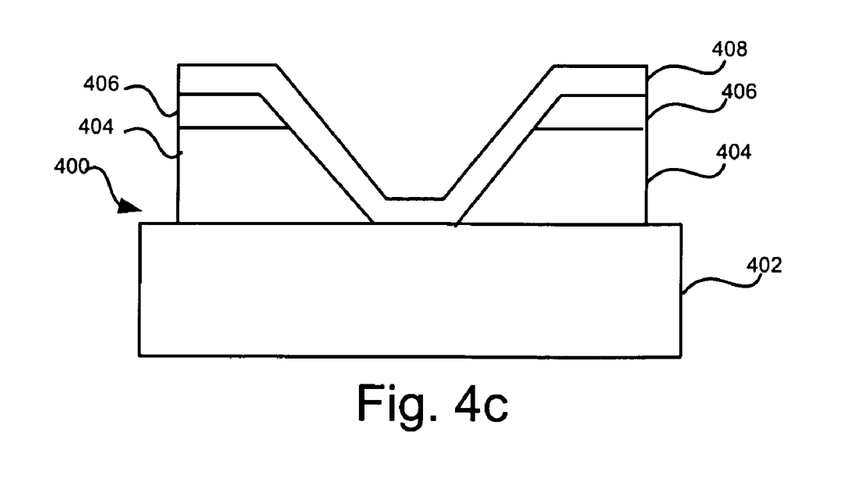
Figure 4D:
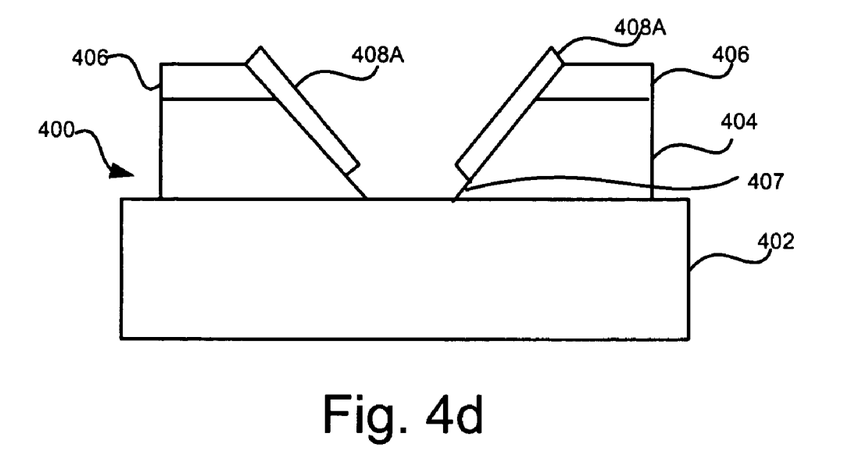
Figure 4E:
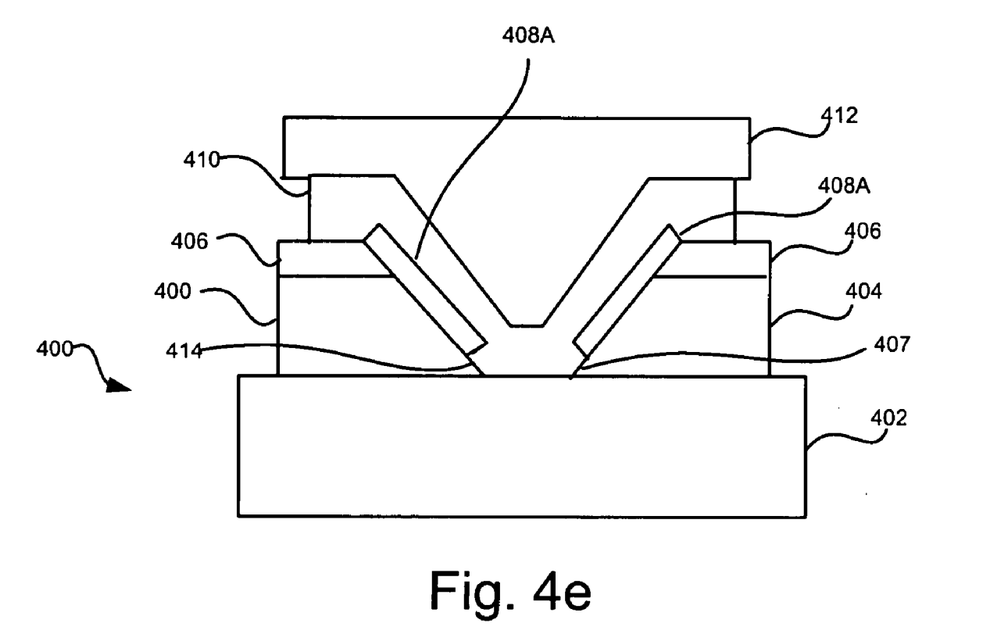

Referring to FIG. 4b, the electrode 404 of the device 400 includes a tapered cavity 407. Similar to the tapered cavity 307 of the electrode 304, the cavity 407 of the electrode 404 is inwardly tapered and includes a wide portion and a narrow portion. However, in contrast to the cavity 307 of the electrode 304, inner walls of the cavity 407 of the electrode 404 do not converge into a vertex. Instead, from the sectional view as shown in FIG. 4b, the tapered cavity 407 appears "truncated". Accordingly, as shown in FIG. 4e, shape of an area 410 (e.g., "contact area") between the electrode 404 and the phase change feature 410 differs from the contact area 314 between the electrode 304 and the phase change feature 310 of FIG. 3e, and is substantially "truncated V-shaped".

Figure 5:
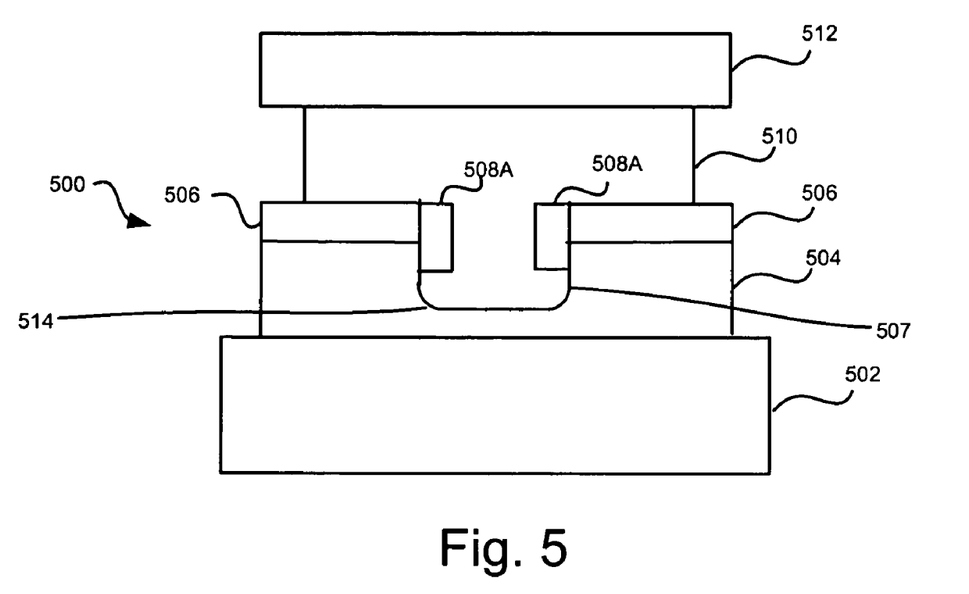
FIG. 5 is a sectional view of a memory device according to a second alternative embodiment.

FIG. 5 is a sectional view of a memory device, indicated generally at 500, in a final stage of manufacture, according to a second alternative embodiment. Similar to the memory devices 300 and 400, the memory device 500 includes a substrate 502, an electrode 504 including a tapered cavity 507, an insulator 506, a remaining insulator portion 508A, phase change feature 510, and an electrode 512. The tapered cavity 507 of the memory device 500 is substantially "U-shaped" in cross section. Accordingly, a contact area 514 of the memory device 500 is also substantially "U-shaped."

In one example, the contact area 514 is also "truncated U-shaped." Such truncated U-shaped contact area 514 is formed by providing a first dielectric layer (e.g., a spin-on-coating dielectric such as SOG) into the cavity 507 that has a thickness less than the electrode 504. Also, a second dielectric insulator, having a wet etch rate different from the first dielectric layer, is formed. A spacer like structure, adjacent sidewalls of the electrode 504, is formed, and the first dielectric layer us exposed by an etch back method. The first dielectric layer is removed (e.g., partially or entirely) by a wet etch method (e.g., HF) to form the contact region 514.

Figure 6:
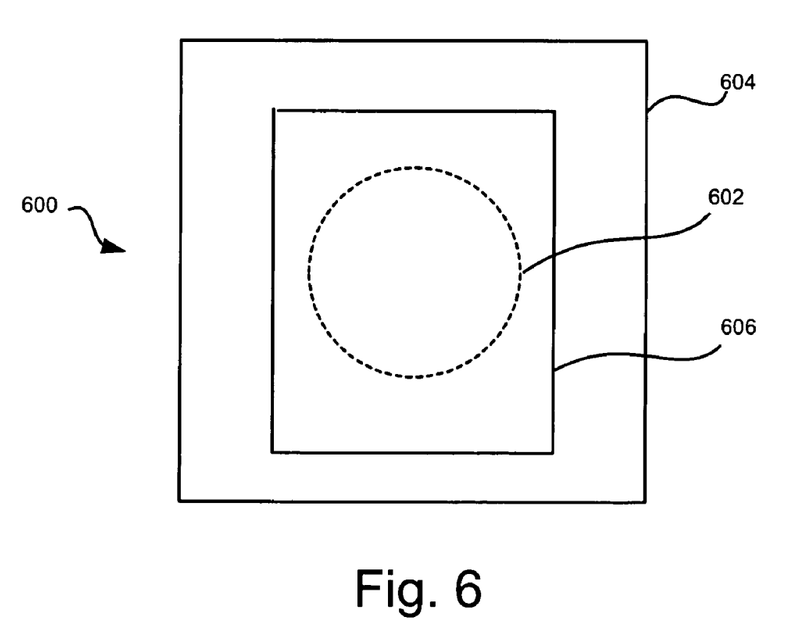
FIG. 6 is a top view of a memory device according to an illustrative embodiment.

FIG. 6. is a top view of a memory device (e.g., the memory devices 300, 400, and 500) indicated generally at 600, in an initial stage of manufacture (e.g., stage depicted in FIG. 3b), according to the embodiments discussed above. The memory device 600 includes an electrode 604, which includes a tapered cavity 602. The memory device 600 also includes a phase change feature 606. As shown, from the top view, the tapered cavity appears round. Accordingly, the tapered cavity 602 is substantially "conical" or substantially "truncated conical" shaped.

Figure 7:
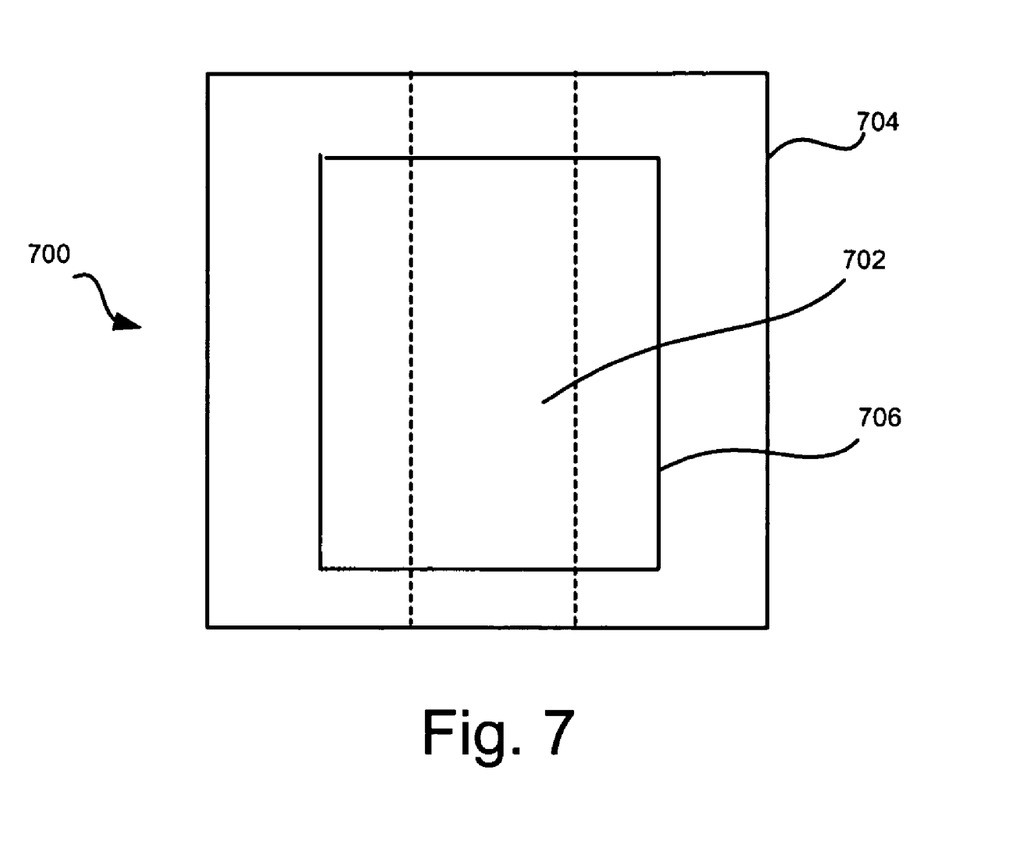
FIG. 7 is a top view of a memory device according to an alternative embodiment.

FIG. 7 is a top view of a memory device (e.g., the memory devices 300, 400, and 500) indicated generally at 700, in an initial state of manufacture (e.g., the stage depicted in FIG. 3b), according to an alternative embodiment. Similar to the memory device 600, the memory device 700 includes an electrode 704 and a phase change feature 706. However, instead of a cavity, the memory device 700 includes an opening that is a tapered groove, as indicated generally at 702. In one example, the tapered groove 702 extends from one end to an opposite end of the electrode 704.

Although illustrative and alternative embodiments have been shown and described, a wide range of modification, change, and substitution is contemplated in the foregoing disclosure and, in some instances, some features of the embodiments may be employed without a corresponding use of other features. Accordingly, broad constructions of the appended claims in manners consistent with the scope of the embodiments disclosed are appropriate.

What is claimed is:

1. A method of manufacturing a memory device, the method comprising:
    forming an electrode over a substrate;
    forming an opening in the electrode to provide a tapered electrode contact surface proximate the opening;
    forming an insulator on a portion of the tapered electrode contact surface; and
    forming a phase change feature over the electrode and on the tapered electrode contact surface and the insulator.

2. The method of claim 1, wherein the tapered contact surface is substantially V-shaped.

3. The method of claim 1, wherein the tapered contact surface is substantially U-shaped.

4. The method of claim 1, wherein the tapered contact surface is substantially truncated V-shaped.

5. The method of claim 1, wherein the phase change feature includes a chalcogenide material.

6. The method of claim 1, wherein the phase change feature is in contact with the tapered electrode contact surface by being in contact with a narrow portion of the contact surface.

7. The method of claim 6, wherein the phase change feature is in contact with the narrow portion of the electrode contact surface by forming the insulator over the electrode, the insulator spanning a wide portion of the opening.

8. The method of claim 1, wherein the phase change feature includes a ternary alloy material.

9. The method of claim 1, wherein the phase change feature includes a quaternary alloy material.

10. The method of claim 1, wherein the phase change feature includes Te alloy.

11. The method of claim 1, wherein the phase change feature includes implanted impurity.

12. The method of claim 1, further comprising:
    implanting impurity to the tapered electrode contact surface.

13. The method of claim 1, wherein forming the phase change feature includes forming a patterned phase change feature via lithography.

14. The method of claim 1, wherein forming the phase change feature includes forming a patterned phase change feature via chemical-mechanical planarizing ("CMP").

15. The method of claim 1, wherein forming the phase change feature includes forming a patterned phase change feature via reactive ion etch back.

16. A method of manufacturing a memory device, the method comprising:
    forming an electrode over a substrate;
    forming a first insulator over the electrode;
    forming an opening in the electrode through the first insulator to provide a tapered electrode contact surface proximate the opening;
    forming a second insulator over the first insulator and the opening of the electrode;
    removing a portion of the second insulator, exposing the first insulator and the tapered electrode contact surface; and
    forming a phase change feature over the first insulator, the second insulator, and on the tapered electrode contact surface.

17. The method of claim 16, wherein the phase change feature includes a chalcogenide material.

18. The method of claim 16, wherein the tapered electrode contact surface is a narrow portion of the opening.

19. The method of claim 16, wherein removing the portion of the second insulator is by removing the portion by reactive ion etch back.

20. The method of claim 16, further comprising:
    implanting impurity to the tapered electrode contact surface.

21. The method of claim 16, wherein removing the portion of the second insulator is by removing the portion by CMP.

22. The method of claim 16, wherein forming the phase change feature includes forming a patterned phase change feature via lithography.

23. The method of claim 16, wherein forming the phase change feature includes forming a patterned phase change feature via chemical-mechanical planarizing ("CMP").

24. The method of claim 16, wherein forming the phase change feature includes forming a patterned phase change feature via reactive ion etch back.

* * * * *